(12) United States Patent
Chin et al.

(10) Patent No.: US 8,207,567 B2
(45) Date of Patent: Jun. 26, 2012

(54) METAL-OXIDE-METAL STRUCTURE WITH IMPROVED CAPACITIVE COUPLING AREA

(75) Inventors: Chao-Chi Chin, Tainan (TW); Ming-Chu King, Hsin-Chu (TW); Chen Cheng Chou, Shanhua Township, Tainan County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 609 days.

(21) Appl. No.: 12/274,255

(22) Filed: Nov. 19, 2008

(65) Prior Publication Data

US 2010/0123214 A1  May 20, 2010

(51) Int. Cl.
*H01L 29/92* (2006.01)

(52) U.S. Cl. .................. 257/303; 257/306; 257/307

(58) Field of Classification Search .......... 257/303, 257/306, 307
See application file for complete search history.

(56) References Cited

U.S. PATENT DOCUMENTS

| 6,624,040 | B1 | 9/2003 | Ng et al. | |
|---|---|---|---|---|
| 6,830,984 | B2 * | 12/2004 | Schultz et al. | 438/393 |
| 7,038,296 | B2 * | 5/2006 | Laws | 257/534 |
| 7,116,544 | B1 * | 10/2006 | Sutardja | 361/306.3 |
| 7,485,912 | B2 * | 2/2009 | Wang | 257/307 |
| 2004/0036143 | A1 | 2/2004 | Hu et al. | |
| 2007/0102745 | A1 | 5/2007 | Hsu et al. | |
| 2007/0158783 | A1 * | 7/2007 | Chen et al. | 257/534 |
| 2007/0235838 | A1 | 10/2007 | Wang | |

FOREIGN PATENT DOCUMENTS

TW    NP-4042-TW A    9/2006

* cited by examiner

*Primary Examiner* — Eugene Lee

(57) ABSTRACT

A stacked metal-oxide-metal (MOM) capacitor structure and method of forming the same to increase an electrode/capacitor dielectric coupling area to increase a capacitance, the MOM capacitor structure including a plurality of metallization layers in stacked relationship; wherein each metallization layer includes substantially parallel spaced apart conductive electrode line portions having a first intervening capacitor dielectric; and, wherein the conductive electrode line portions are electrically interconnected between metallization layers by conductive damascene line portions formed in a second capacitor dielectric and disposed underlying the conductive electrode line portions.

19 Claims, 5 Drawing Sheets

METAL-OXIDE-METAL STRUCTURE WITH IMPROVED CAPACITIVE COUPLING AREA

FIELD OF THE INVENTION

This invention generally relates to metal-oxide-metal (MOM) capacitor structures and more particularly to a damascene stacked MOM capacitor structure and method for forming the same including a simplified layout and manufacturing process to form a MOM with increased capacitive coupling area to improve MOM capacitance.

BACKGROUND OF THE INVENTION

Advances in technology have resulted in an increasing demand for system-on-chip products where both analog and digital signal processing are desirable. For example analog circuits capture an analog signal from the surrounding environment and transform the signal into bits which are then transformed into signals for driving digital circuitry and output functions. Increasingly it is advantageous to have both the analog circuitry and digital circuitry in close proximity, for example in the form digital blocks and analog blocks of circuitry which function together to implement the function of the system, also referred to as mixed mode systems.

For example, passive components (inductors, resistors, and capacitors) in analog/mixed-signal design are used for a wide variety of functions including tuning, filtering, impedance matching, and gain control. For example, MOM capacitors are critical in several mixed signal integrated circuits such as analog frequency tuning circuits, switched capacitor circuits, filters, resonators, up-conversion and down-conversion mixers, and A/D converters.

In metal-oxide-metal (MOM) structures, which are included in analog circuitry building blocks, capacitors with a relatively large capacitance are frequently desirable. MOM structures of the prior art generally achieve a higher level of capacitance by inter-digitated metal line electrodes to achieve capacitors wired in parallel in a particular metallization level.

For example, the MOM capacitor structures of the prior art have relied on metal line electrodes formed in staked metallization levels where the metallization levels are interconnected between metallization layers by metal vias.

Problems in the prior art include the large number of stacked metallization layers and associated interconnecting vias to achieve a desired level of capacitance, thereby utilizing valuable semiconductor area and volume.

There is therefore a need in the semiconductor device processing art for improved MOM capacitor structures and manufacturing processes to achieve a higher capacitance value while minimizing the size of the MOM structure and achieving the same in a cost effective manner.

It is therefore an object of the invention to provide an improved MOM capacitor structure and manufacturing process to achieve a higher capacitance value while minimizing the size of the MOM structure, in addition to overcoming other deficiencies and shortcomings of the prior art.

SUMMARY OF THE INVENTION

To achieve the foregoing and other objects, and in accordance with the purposes of the present invention, as embodied and broadly described herein, the present invention provides a stacked metal-oxide-metal (MOM) capacitor structure and method of forming the same to increase an electrode/capacitor dielectric coupling area to increase a capacitance.

In a first embodiment, the MOM capacitor structure includes a plurality of metallization layers in stacked relationship; wherein each metallization layer includes substantially parallel spaced apart conductive electrode line portions having a first intervening capacitor dielectric; and, wherein the conductive electrode line portions are electrically interconnected between metallization layers by conductive damascene line portions formed in a second capacitor dielectric and disposed underlying the conductive electrode line portions.

These and other embodiments, aspects and features of the invention will become better understood from a detailed description of the preferred embodiments of the invention which are described in conjunction with the accompanying drawings.

DETAILED DESCRIPTION OF THE PREFERRED EMBODIMENTS

While the MOM capacitor structure and method for forming the same according to the present invention is described with reference to exemplary damascene structures it will be appreciated that the damascenes may be formed by conventional single or dual damascene processes.

Figure 1:
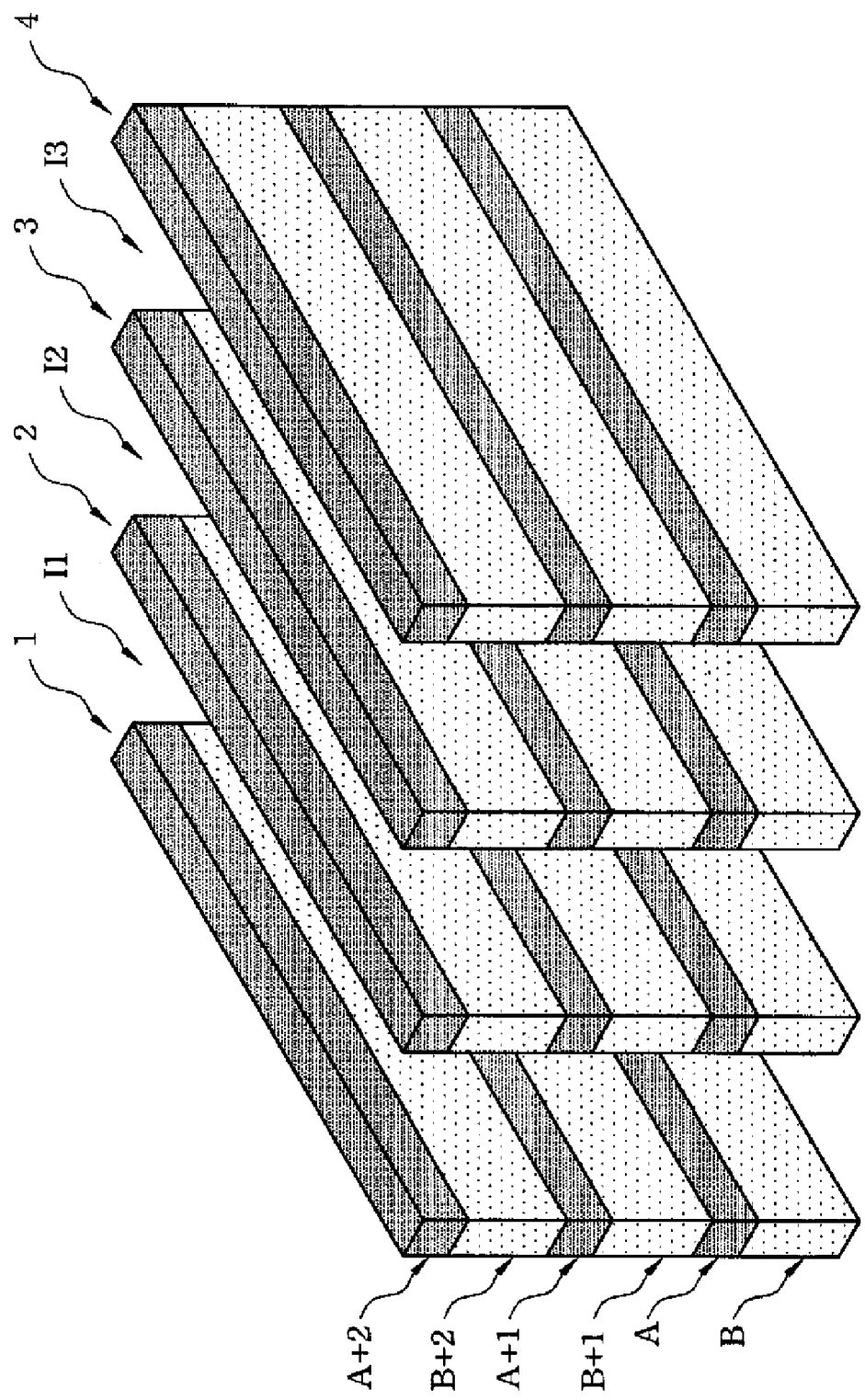
FIG. 1 is an exemplary 3-dimensional view of a portion of a MOS capacitor structure according to an embodiment of the present invention.

Referring to FIG. 1 is shown an exemplary stacked metallization structure in a 3-dimensional representation showing only the metal portions, to better exemplify the MOM capacitor structure of the present invention. It will be appreciated that one or more capacitor dielectric materials e.g., I1, I2, and I3, preferably a metal oxide, is disposed in the space between the rows e.g., 1, 2, 3, and 4 of the stacked metal line electrodes/trench vias of the MOM structure. The stacked metal line electrodes/trench vias of the MOM structure are spaced apart by a predetermined distance, depending on the intervening capacitor dielectric material, to achieve a desired capacitance value.

The capacitor dielectric may be formed of silicon oxide based materials such as undoped silicate glass (USG), fluorinated silicate glass (FSG), PECVD silicon oxide, and oxide/nitride/oxide.

In addition, the capacitor dielectric may be formed of one or more high-K (high dielectric constant) materials, preferably having a dielectric constant of at least 8, such as $Ta_2O_5$, $HfO_2$, HfON, $Ba_xSr_{(1-x)}TiO_3$ (BST), $BaTiO_3$, $SrTiO_3$, $PbTiO_3$, $Pb(Zr,Ti)O_3$ [PZT], $(Pb,La)(Zr,Ti)O_3$ [PLZT], $(Pb,La)TiO_3$ [PLT], $Ta_2O_5$, $KNO_3$, $Al2O_3$, and $LiNbO_3$.

For example, shown are stacked metal rows, e.g., 1, 2, 3, 4, where each of the metal line electrodes in the respective rows, e.g., A+2, A+1, and A, are formed in respective metallization levels.

Instead of having vias interconnecting the respective metal line electrodes between metallization layers, as in prior art processes, the present invention provides for trench vias, e.g., B+2, B+1, and B formed as damascene structures between metallization levels to interconnect the metal line electrodes in the respective rows.

It will be appreciated that the trench vias, e.g., B+2, B+1, and B may be formed of the same or different metal than the metal line electrodes, e.g., A+2, A+1, and A. For example, the metal line electrodes may be formed by depositing a metal layer followed by etching to define the metal line electrodes, followed by forming an overlying capacitor dielectric layer. The trench vias are preferably formed by a damascene process where the same or different capacitor dielectric material is first deposited, followed by patterning and plasma etching to form an opening, followed by filling with metal and planarization. Alternatively, both the metal line electrodes and the trench vias may be formed by separate single damascene processes with the same or different metals and formed in the same or different capacitor dielectric material layers. In another embodiment, the metal line electrodes and the trench vias may be formed by a dual damascene process and formed of the same metal. The capacitor dielectric disposed between the metal line electrodes may be the same or different from the capacitor dielectric disposed between the trench vias, but is more preferably the same capacitor dielectric. Preferably, the trench via lines have about the same or smaller width and length, preferably about the same, than the metal line electrodes. Preferably the metal line electrodes encompass the trench vias to aid in alignment of the trench via lines with respect to the metal line electrodes.

For example, the capacitor dielectric disposed between the stacked structure of metal line electrode/trench via/metal line electrode etc., e.g., I1, I2, I3, is formed of a metal oxide dielectric, which together with adjacent metal line electrodes, forms a capacitor. For example, the distance between metal line electrode portions is greater than about 2000 Angstroms. The stacked metal structure e.g., metal line electrode/trench via/metal etc., forms the effective electrode capacitive coupling portion of the capacitor.

It will be appreciated that there is no limit on the number of metal line electrodes in a metallization level, or the number of metallization levels that may be used to form a series of capacitors, preferably wired in parallel as explained below. Preferably, there are at least four metal line electrodes in a single metallization layer and at least two metallization layers interconnected between metallization levels by trench vias to form at least 3 capacitors by being wired in parallel to impose a signal (voltage) across the capacitor dielectric.

Figure 2:
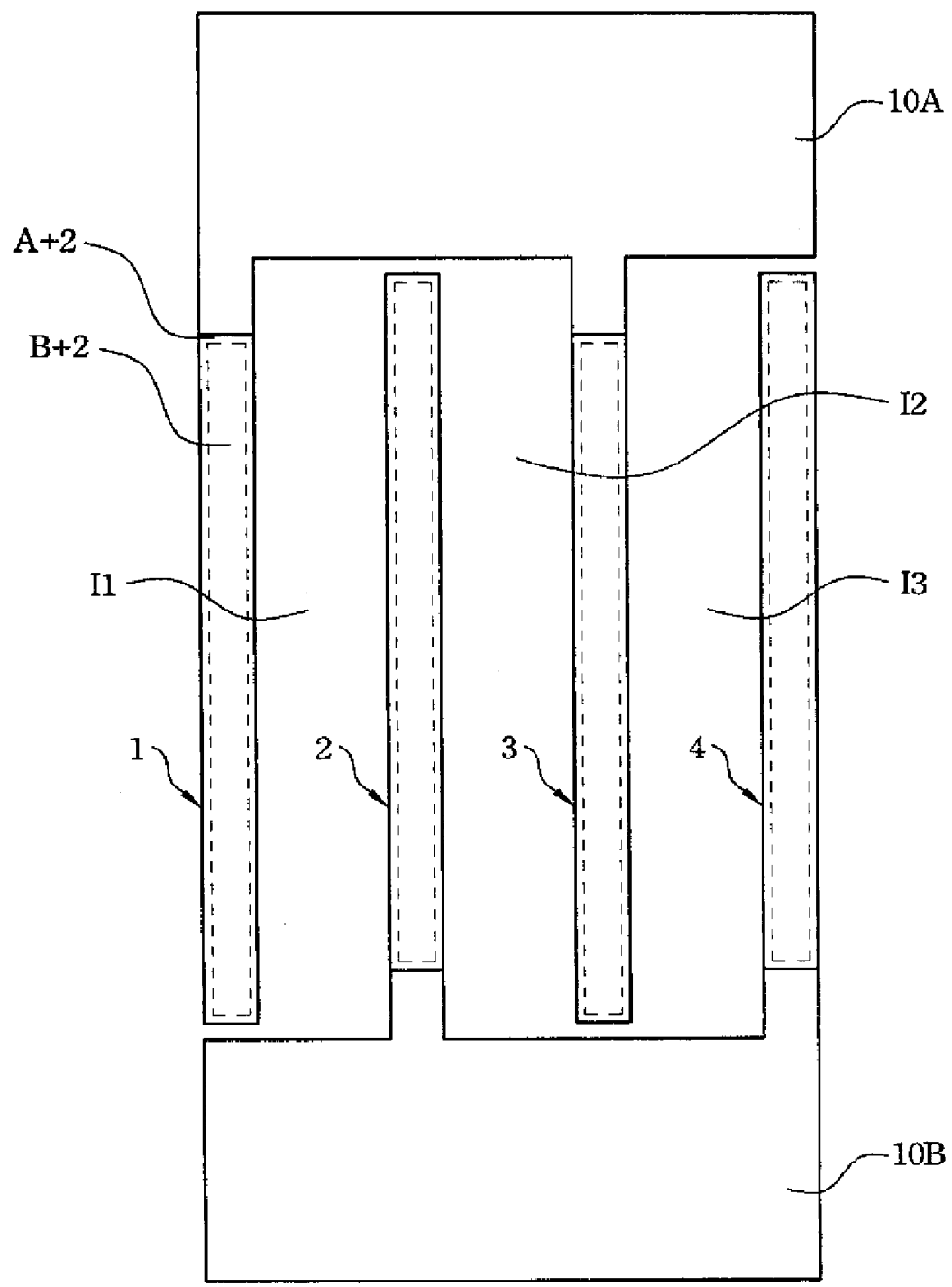
FIG. 2 is an exemplary top planar view of a portion of a MOS capacitor structure according to an embodiment of the present invention.

For example, referring to FIG. 2, is shown an exemplary top planar view of a MOM capacitor structure according to an embodiment of the present invention where individual capacitors are wired in parallel. Shown is a top view through a cross-section of a metallization level e.g., A+2 including metal line electrodes 1, 2, 3, and 4, and showing respective underlying trench via e.g., B+2 by dotted line portions. Signal source interconnects 10A and 10B are shown, e.g., formed in the metallization level A+2, as well as in underlying metallization levels. The signal source interconnects in the metallization levels may be interconnected between metallization levels by either vias or trench vias. The signal source interconnects 10A and 10B are preferably connected in an interdigitated fashion, e.g., connected respectively to alternating metal line electrodes e.g., 1 and 3, and 2 and 4, to form at least 3 capacitor structures, e.g., having intervening capacitor dielectric portions I1, I2, and I3.

Figure 3A:
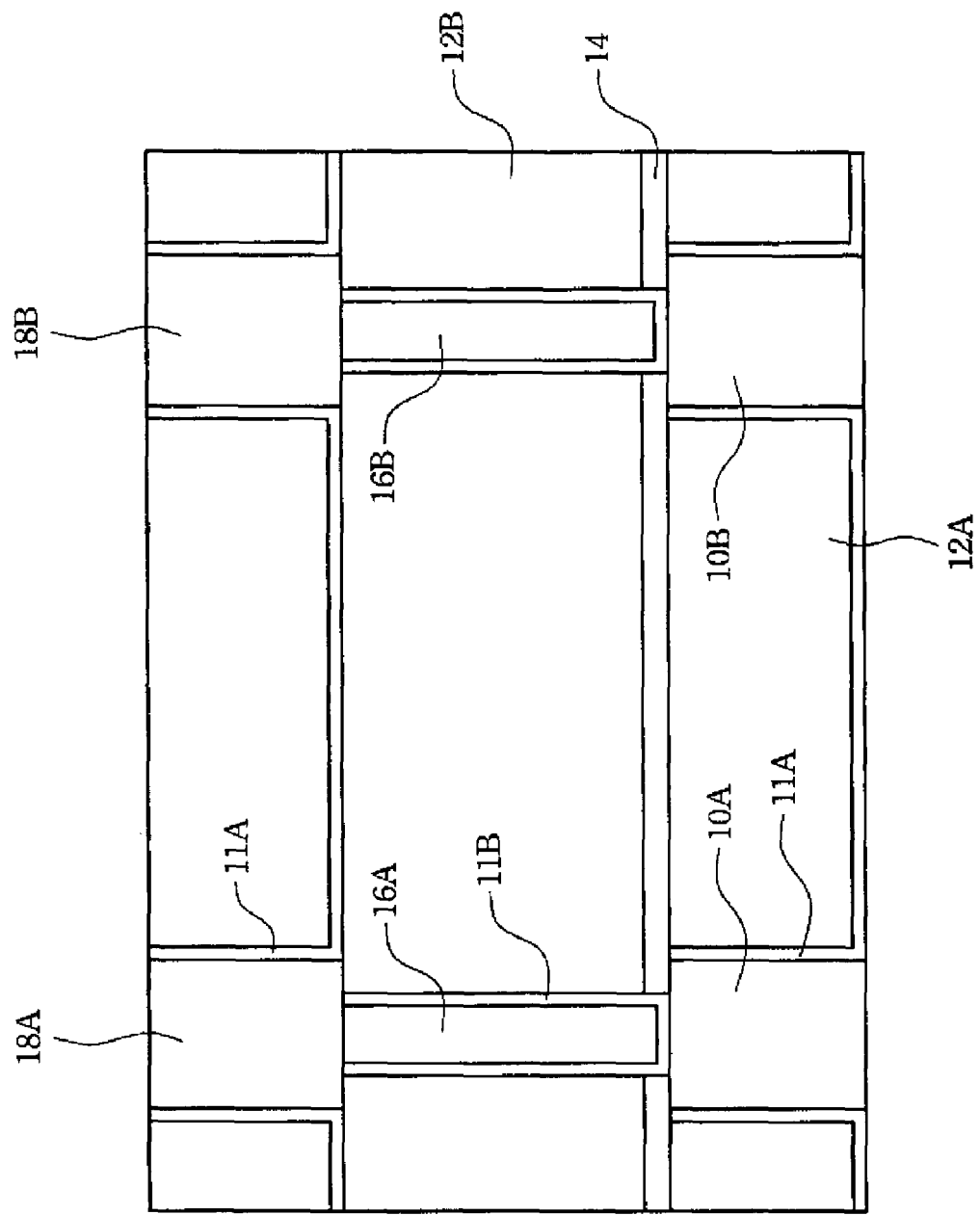
FIGS. 3A and 3B are cross sectional views of a portion of a MOS capacitor structure at a processing stage according to an embodiment of the present invention.

For example, referring to FIG. 3A, in an exemplary method for forming the stacked MOM structure, a first metallization layer including metal line electrode portions e.g., 10A and 10B are formed.

For example, the metal line electrode portions are formed by depositing a layer of metal followed by a metal etching process to define the metal line electrode portions, followed by deposition of an optional barrier layer e.g., 11A. The capacitor dielectric layer 12A is then formed over the metal line portions e.g., 10A and 10B by conventional spin-on, CVD, PECVD, or HDPCVD processes, followed by planarization (e.g., CMP). An etch stop layer 14 then is optionally formed over the capacitor dielectric layer 12A, e.g., silicon carbide optionally doped with oxygen and/or nitrogen, or silicon nitride optionally doped with oxygen and/or nitrogen, formed by conventional CVD or PEVCD processes.

A second capacitor dielectric layer, 12B, the same or different material as capacitor dielectric 12A, is then deposited followed by a conventional photolithographic patterning process to pattern and etch trench vias overlying the metal electrode line portions according to preferred embodiments. In a single damascene process, the trench vias are then optionally lined with a barrier layer e.g., 11B, followed by filling with metal and planarization (e.g., CMP) to form metal filled trench vias e.g., 16A and 16B. Overlying metal line electrode portions e.g., 18A and 18B, are then formed by a similar process as metal line portions 10A and 10B.

Figure 3B:
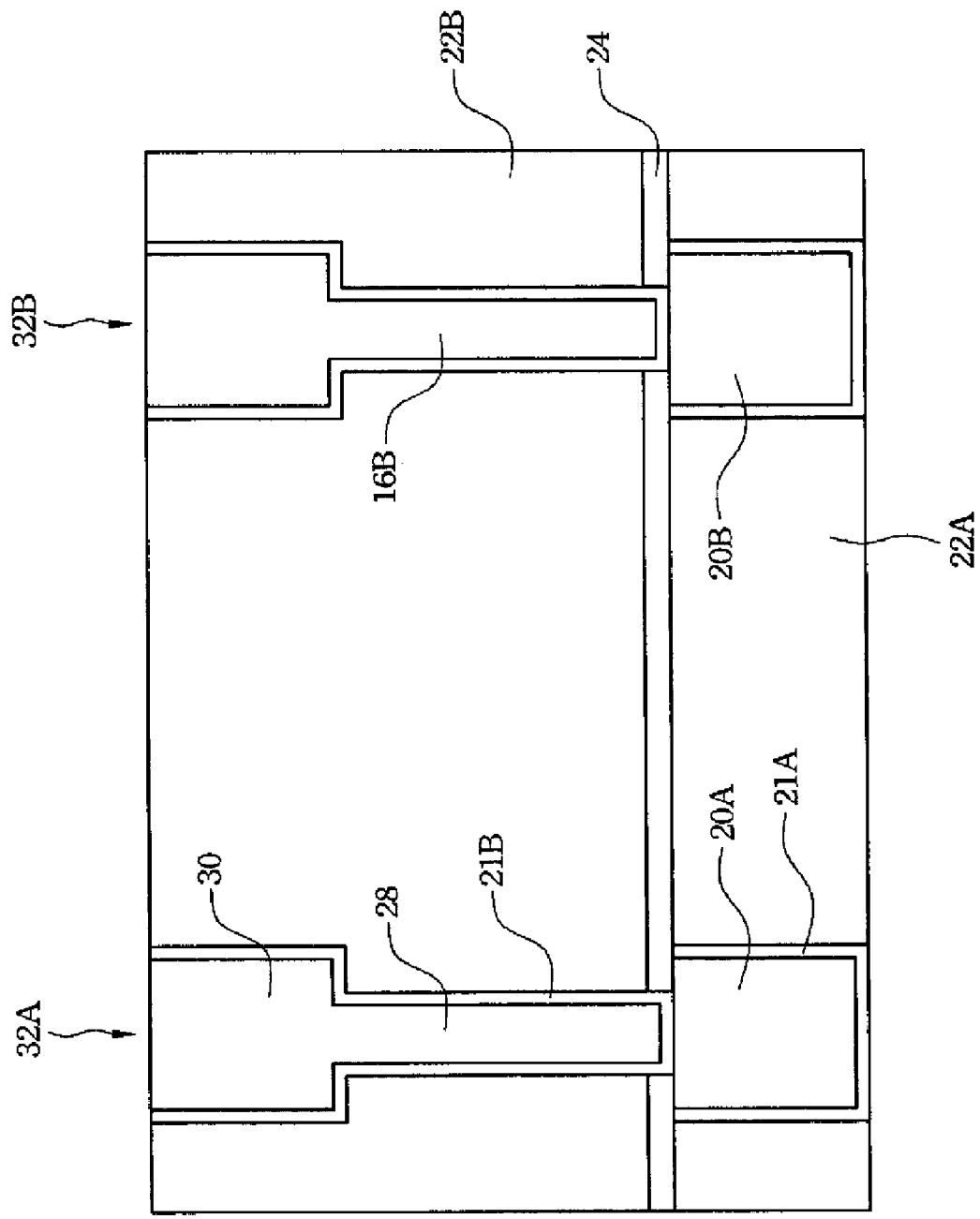

Referring to FIG. 3B, in an exemplary damascene method for forming the stacked MOM structure, e.g., a dual damascene process, metal line electrode portions 20A and 20B are provided in first capacitor dielectric layer 22A, e.g., by a single or dual damascene process. For example, a metal electrode opening is first etched by a plasma process, followed by optional barrier layer 21A deposition, followed by a metal filling process and then planarization e.g., CMP. Etch stop layer 24 is then optionally formed over the capacitor dielectric layer 22A, followed by formation of a second capacitor dielectric layer 22B, the same or different than material capacitor dielectric layer 22A.

Conventional photolithographic patterning and plasma etching steps are then carried out to first form trench via portions e.g., 28, followed by a similar process to form metal electrode line portions e.g., 30. A barrier layer 21B is then deposited to line the metal electrode line portions and the trench via portions, similar to a dual damascene process. A single metal filling process, followed by planarization (e.g., CMP) is then carried out to define the metal line electrode/trench via structures e.g., 32A and 32B to form a stacked metal line electrode/trench via/metal line electrode MOS structure. It will be appreciated that an intervening etch stop layer (not shown) may be formed at the metal line electrode/trench via level between two capacitor dielectric layers, and that the metal line electrode portions and the trench via portions may be formed by separate single damascene processes and filled with different metals. The metal line electrode portion and the trench via may be formed of any conductive material, preferably a metal, including one or more of Cu, AlCu, Ta, Ti, or W. The barrier layers may be an appropriate refractory metal and/or a refractory metal nitride to prevent metal diffusion into the capacitor dielectric layer.

Thus, an improved metal-oxide-metal capacitor structure and method for forming the same has been presented where an increased electrode capacitive coupling area is provided by trench vias to increase a capacitance of the structure without increasing the volume of the capacitor structure. For example, the MOM capacitor structures of the present invention have been able to increase an effective capacitance by about 25% compared to a similar structure where conventional vias are used. For example, an effective capacitance of about 1.43 femtofarads/micron$^2$ can be increased to about 1.79 femtofarads/micron$^2$ according to preferred embodiments.

Moreover, the MOM capacitor structure of the present invention is compatible with existing ULSI fabrication processes and can be implemented without additional masking and etching steps.

In addition, a larger capacitance value is achieved without increasing the chip area dedicated to device formation on a semiconductor chip.

Figure 4:
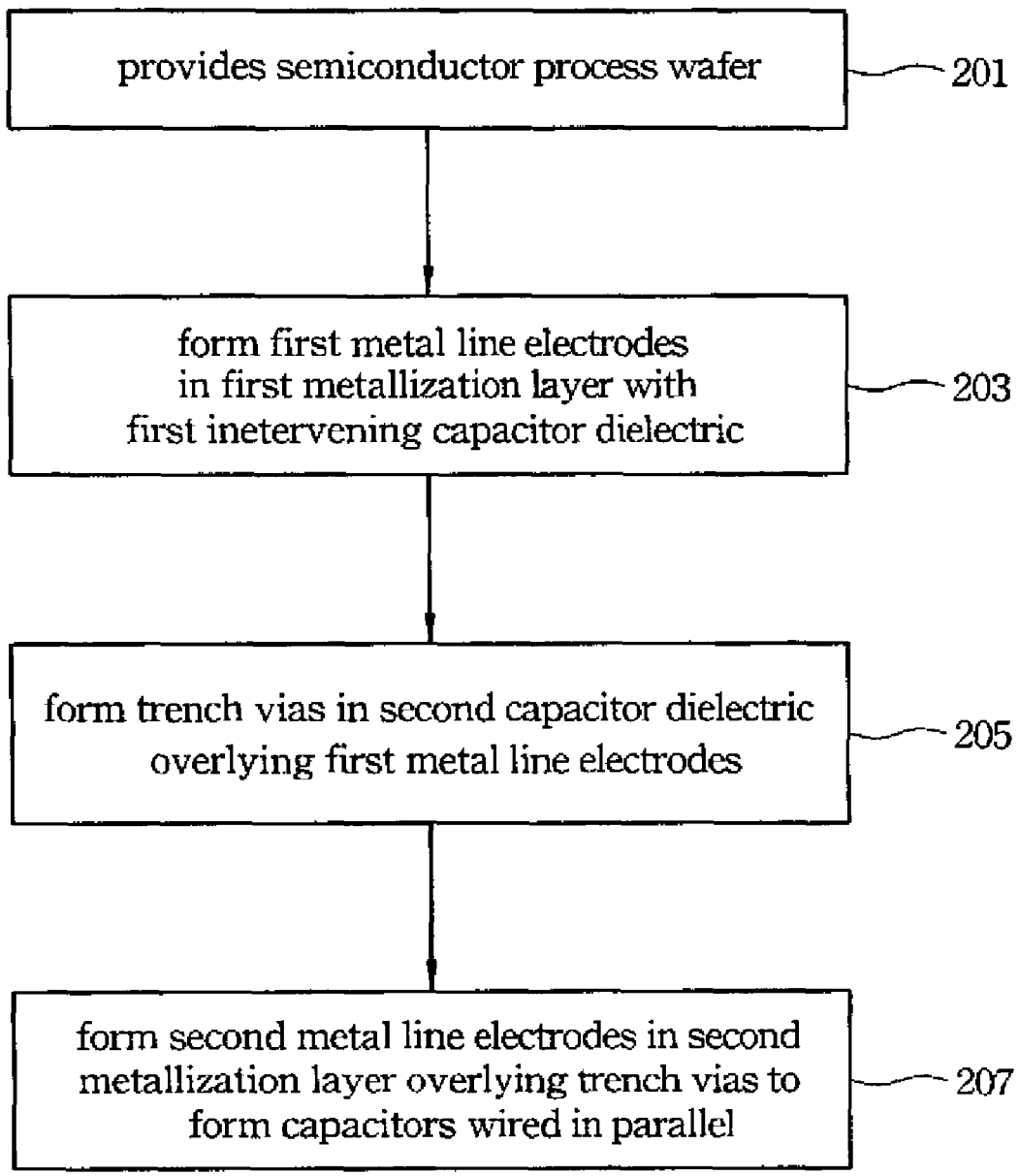
FIG. 4 is a process flow diagram including several embodiments of the present invention.

Referring to FIG. 4 is a process flow diagram including several embodiments of the present invention. In process 201, a semiconductor process wafer is provided. In process 203, metal line electrodes are formed in a first metallization layer with an intervening first capacitor dielectric material. In process 205 trench via damascenes are formed over the metal line electrodes a second capacitor dielectric material the same or different than the first capacitor dielectric material. In process 207, second metal line electrodes are formed over the trench via damascenes with an intervening third capacitor dielectric material the same or different than the first and second capacitor dielectric material. The metal line electrodes in the metallization layers are formed to connect to a signal source where alternating metal line electrodes are electrically connected to a common signal source to form interdigitated capacitors wired in parallel.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A stacked metal-oxide-metal (MOM) capacitor structure comprising:
   a plurality of metallization layers;
   wherein each metallization layer comprises substantially parallel spaced apart conductive electrode line portions separated by a first intervening capacitor dielectric; and,
   wherein the conductive electrode line portions that are adjacent along a first direction are electronically interconnected by conductive damascene line portions and wherein the conductive damascene line portions are disposed in a second capacitor dielectric.

2. The MOM capacitor structure of claim 1, wherein alternating conductive electrode line portions are electrically connected respectively to first and second common electrical interconnects to supply a signal source to form capacitors wired in parallel.

3. The MOM capacitor structure of claim 1, wherein the conductive damascene line portions are each disposed in a corresponding trench having a width and length about the same or less than the respective conductive electrode line portions and the conductive electrode line portions and the conductive damascene line portions are substantially parallel to one another.

4. The MOM capacitor structure of claim 1, wherein the conductive electrode line portions overlie and encompass the conductive damascene line portions.

5. The MOM capacitor structure of claim 1, wherein the first and second capacitor dielectrics are formed of different materials.

6. The MOM capacitor structure of claim 1, wherein the first and second capacitor dielectrics comprise a metal oxide.

7. The MOM capacitor structure of claim 1, wherein the conductive electrode line portions and the conductive damascene line portions comprise a metal.

8. The MOM capacitor structure of claim 1, wherein the conductive electrode line portions and the conductive damascene line portions comprise different metal layers.

9. The MOM capacitor structure of claim 1, wherein the conductive electrode line portions and the conductive damascene line portions comprise the same metal.

10. The MOM capacitor structure of claim 8, wherein the metal is selected from the group consisting of Ta, W, Ti, Al, and Cu.

11. The MOM capacitor structure of claim 1, wherein the distance between the conductive electrode line portions is greater than about 2000 Angstroms.

12. The MOM capacitor structure of claim 1, further comprising electrical interconnects disposed in each metallization layer for respectively supplying a signal to alternating conductive electrode line portions.

13. The MOM capacitor structure of claim 12, wherein the electrical interconnects are electrically interconnected between layers by features selected from the group consisting of vias and trench lines.

14. A stacked metal-oxide-metal (MOM) capacitor structure with increased capacitance per unit area comprising:
   a plurality of metallization layers;
   wherein each metallization layer comprises a plurality of substantially parallel spaced apart conductive electrode line portions separated by an intervening first capacitor dielectric;
   wherein the conductive electrode line portions that are adjacent along a first direction are electrically interconnected by conductive damascene line portions to form a plurality of sub-structures, the conductive damascene line portions disposed in a second capacitor dielectric; and,
   wherein alternating sub-structures of the plurality of sub-structures are electrically connected respectively to first and second common electrical interconnects.

15. The MOM capacitor structure of 14, wherein the sub-structures are formed of a stack of conductive materials and the first and second common electrical interconnects are formed of the stack of conductive materials.

16. The MOM capacitor structure of claim 1, wherein the conductive electrode line portions are parallel to the conductive damascene line portions.

17. The MOM capacitor structure of claim 16, wherein the conductive electrode line portions and the conductive damascene line portions have substantially the same length.

18. The MOM capacitor structure of claim 1, wherein the metallization layers are stacked in a first direction over a semiconductor wafer, the first direction perpendicular to a direction of the semiconductor wafer.

19. The MOM capacitor structure of claim 14, wherein the metallization layers are stacked in a first direction over a semiconductor wafer, the first direction perpendicular to a direction of the semiconductor wafer and wherein said alternating sub-structures of the plurality of sub-structures are laterally connected respectively to said first and second common interconnects.

* * * * *